(12) United States Patent
Namikawa et al.

(10) Patent No.: US 6,340,535 B2
(45) Date of Patent: Jan. 22, 2002

(54) METHOD FOR THE HEAT TREATMENT OF A ZNSE CRYSTAL SUBSTRATE, HEAT TREATED SUBSTRATE AND LIGHT EMISSION DEVICE

(75) Inventors: Yasuo Namikawa, Osaka; Shinsuke Fujiwara, Itami, both of (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/859,580

(22) Filed: May 18, 2001

(30) Foreign Application Priority Data

May 19, 2000 (JP) .......................... 12-147588

(51) Int. Cl.⁷ .................. B32B 15/04; H01L 21/22
(52) U.S. Cl. ............. 428/650; 148/33.3; 252/62.3; 252/501.1; 420/903; 428/620; 428/654; 428/658; 428/926; 428/941; 438/510; 438/558; 438/559; 438/560; 438/658

(58) Field of Search ............... 428/650, 654, 428/658, 926, 941, 620; 252/62.3, 501.1; 148/33.3; 420/903; 438/510, 558, 559, 560, 658

(56) References Cited

U.S. PATENT DOCUMENTS 5,933,751 A * 8/1999 Hirota .................. 438/558

* cited by examiner

*Primary Examiner*—Robert R. Koehler
(74) *Attorney, Agent, or Firm*—Smith, Gambrell & Russell, LLP

(57) ABSTRACT

This invention relates to a method for the heat treatment of a ZnSe crystal substrate to dope it with Al as a donor impurity, a ZnSe crystal substrate prepared by this heat treatment and a light-emitting device using the ZnSe crystal substrate, in particular, the method for the heat treatment of a ZnSe crystal substrate comprising previously forming an Al film on the substrate, first subjecting the substrate to a heat treatment in a Se atmosphere and then subjecting to a heat treatment in a Zn atmosphere.

9 Claims, 6 Drawing Sheets

ENLARGED VIEW OF ZnSe WAFER

ENLARGED VIEW OF ZnSe WAFER

| No. | TREATMENT | CARRIER CONCENTRATION |
|---|---|---|
| ① | Se,Zn TWO STAGE TREATMENT | $2.1 \times 10^{17}$ |
| ② |  | UNDOPE |
| ③ | Zn TREATMENT | $5.1 \times 10^{17}$ |
| ④ | Zn TREATMENT | $8.5 \times 10^{17}$ |
| ⑤ | Zn TREATMENT | $9.1 \times 10^{17}$ |

METHOD FOR THE HEAT TREATMENT OF A ZNSE CRYSTAL SUBSTRATE, HEAT TREATED SUBSTRATE AND LIGHT EMISSION DEVICE

BACKGROUND OF THE INVENTION

1. Field of the Invention

This invention relates to a method for the heat treatment of a ZnSe crystal substrate to dope it with Al as a donor impurity, a ZnSe crystal substrate prepared by this heat treatment and a light-emitting devices using the ZnSe crystal substrate.

2. Description of the Related Art

ZnSe-based light-emitting devices have been noticed with keen interest in particular, as light-emitting devices of LED and LD in a region of blue, green or blue green. These light-emitting devices can also be formed on a GaAs substrate, but from the standpoint of improving the property of such a device, it is, of course, desirable to prepare a ZnSe-based thin film by homoepitaxial growth on a ZnSe substrate. For the purpose of simplifying the device structure and improving the device property, an electrically conductive, low resistance substrate is indispensable. However, a ZnSe bulk single crystal ordinarily prepared by a PVT (Physical Vapor Transport) method or GG (Grain Growth) method, etc. is undoped and highly resistant.

Up to the present time, as a method for rendering a ZnSe single crystal low-resistant, it has been proposed to subject the ZnSe single crystal to a heat treatment in a Zn—Al melt in an atmosphere of Zn, thus obtaining a low resistance ZnSe single crystal (J. Phys. D: Appl. Phys. Vol. 9, 1976, p. 799–810, G. Jones et al.). According to this method, Al can be diffused in the ZnSe crystal to act as a donor impurity, while simultaneously, the Zn vacancy concentration can be lowered to increase the activation efficiency of Al and to increase the n-type carrier concentration, thus resulting in a desired specific resistance.

In this heat treatment method, however, there arise some problems that the ZnSe single crystal cannot be prevented from adhesion of the Zn—Al solid during cooling, the dislocation density of the ZnSe single crystal is increased and its crystalline property is markedly deteriorated because of stress due to difference in thermal expansion coefficients between ZnSe and the Zn—Al solid. In order to solve this problem, there has been proposed a method comprising forming an Al thin film on a surface of ZnSe single crystal and then subjecting them to a heat treatment in Zn atmosphere in a closed vessel (Japanese Patent No. 02839027). According to this method, marked deterioration of the crystalinity has been suppressed.

In a ZnSe substrate in which Al is diffused with a high concentration, the absorption edge shifts towards the longer wavelength side to cause such a phenomenon that blue light and blue-green light are absorbed and longer wavelength lights of from yellow to red are re-emitted (which longer wavelength light emission is generally called SA emission). Utilizing this phenomenon, white LED has been developed. This LED is capable of emitting white light by mixing blue green light from the activation layer and yellow SA emission from the substrate.

In the case of preparing a monochromatic LED of blue or blue-green, however, there is a problem such that a pure monochromatic light is hard to obtain because of mixing of this SA emission.

SUMMARY OF THE INVENTION

It is an object of the present invention to provide a method for the heat treatment, whereby the above described problems can be solved and a ZnSe crystal substrate having an electrical conductivity and good crystallinity as well as a low SA emission intensity can be prepared with good re-producibility.

It is another object of the present invention to provide a ZnSe crystal substrate prepared by the above described method for the heat treatment.

It is a further object of the present invention to provide a light-emission device using the ZnSe crystal substrate.

These objects can be attained by a method for the heat treatment of a ZnSe crystal substrate by diffusing Al through the ZnSe crystal substrate, comprising previously forming an Al film on the substrate, first subjecting the substrate to a heat treatment in a Se atmosphere and then subjecting to a heat treatment in a Zn atmosphere.

BRIEF DESCRIPTION OF THE DRAWINGS

The accompanying drawings illustrate the principle and merits of the present invention in detail.

DETAILED DESCRIPTION OF THE INVENTION

Figure 1:
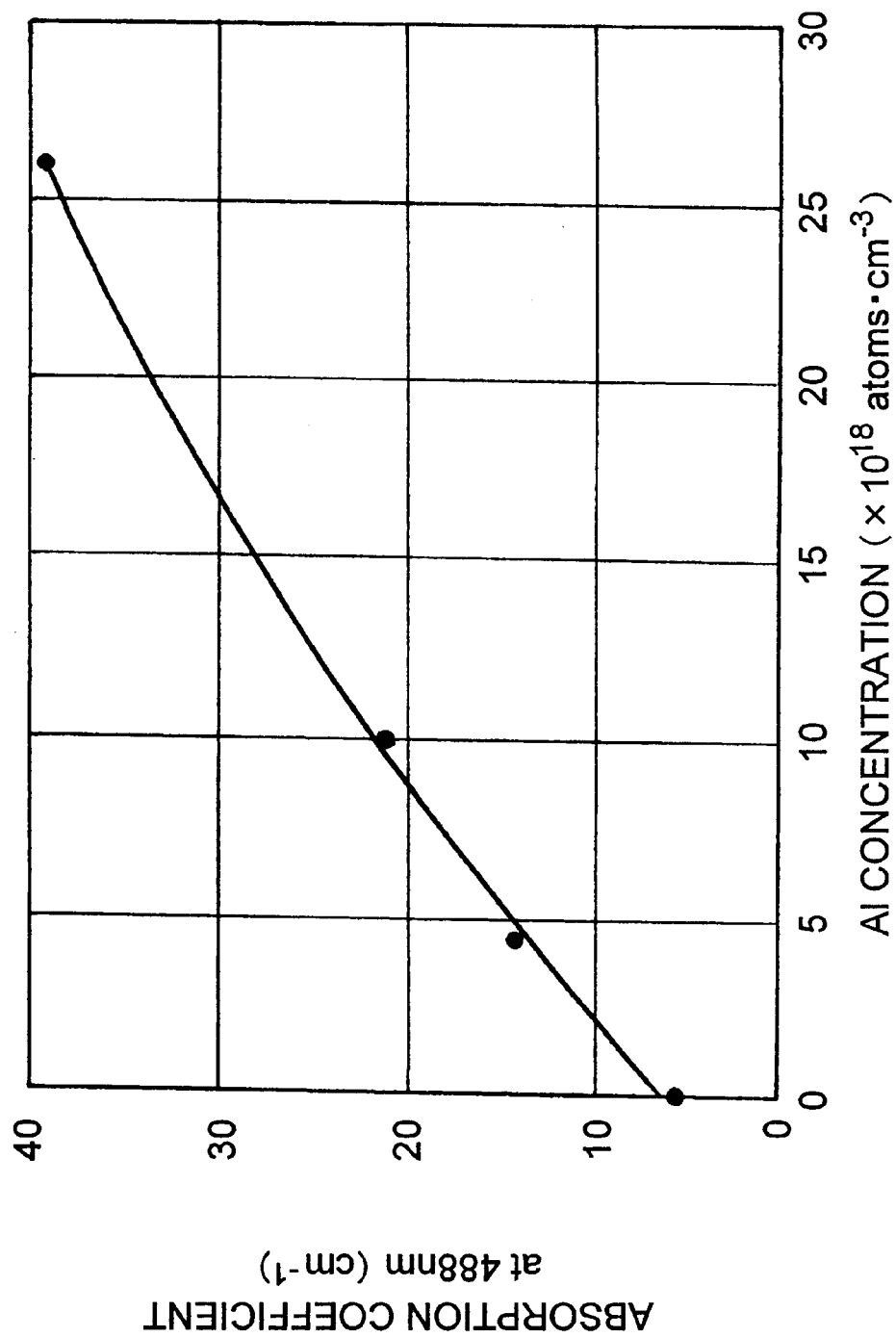
FIG. 1 is a graph showing a relationship between an Al concentration in ZnSe and absorption coefficient at 488 nm.

The inventors have made various efforts to develop a method for the beat treatment of a ZnSe crystal substrate to dope it with Al a donor-like impurity, and have succeeded in achieving the objects by the following construction or embodiments of the present invention.

(1) A method for the heat treatment of a ZnSe crystal substrate by diffusing Al through the ZnSe crystal substrate, comprising previously forming an Al film on the substrate, first subjecting the substrate to a heat treatment in a Se atmosphere and then subjecting to a heat treatment in a Zn atmosphere.

(2) The method for the heat treatment of a ZnSe crystal substrate, as described in the foregoing (1), wherein the Al film has a thickness of ranging from 50 to 5000 Å.

(3) The method for the heat treatment of a ZnSe crystal substrate, as described in the foregoing (1) or (2), wherein the heat treatment is carried out under such a state that a ZnSe film is formed on the Al film of the ZnSe crystal substrate, the ZnSe crystal substrate is contacted therewith or the Al film of the Al film-formed ZnSe crystal substrate is contacted.

(4) The method for the heat treatment of a ZnSe crystal substrate, as described in any one of the foregoing (1) to (3), wherein the heat treatment in the Se atmosphere comprises a step of charging the ZnSe crystal substrate and Se in a heat treatment vessel provided with a high temperature part of at 960 to 1200° C. and a low temperature part of 600 to 1000° C., being lower by 10 to 500° C. than the high temperature part, arranging the ZnSe crystal substrate to be positioned at the high temperature part and maintaining at a high temperature with controlling the Se vapor pressure.

(5) The method for the heat treatment of a ZnSe crystal substrate, as described in any one of the foregoing (1) to (4), wherein the heat treatment in the Zn atmosphere comprises a step of charging the ZnSe crystal substrate and Zn in a heat treatment vessel and maintaining at a high temperature of 660 to 1200° C., and a step of cooling while maintaining a low temperature zone being lower by 1 to 100° C. than the ZnSe crystal substrate in the closed container.

(6) A ZnSe crystal substrate treated by the heat treatment method as described in any one of the foregoing (1) to (5).

(7) The ZnSe crystal substrate as described in the foregoing (6), wherein an Al concentration is in a range of $2 \times 10^{17}$ to $2 \times 10^{18}$ atoms·cm$^{-3}$ in a zone of from the substrate surface to a depth of upto 300 $\mu$m.

(8) A light emission device prepared using the ZnSe crystal substrate described in the foregoing (6) or (7).

In the present invention, "heat treatment" is defined to mean a whole process comprising a series of steps of raising a temperature, maintaining the raised temperature and cooling, unless otherwise indicated. The maintaining the raised temperature includes not only a case of maintaining a constant temperature, but also a case of changing a temperature on the way, followed by maintaining in order a plurality of temperatures, or continuously changing the temperature with passage of time.

As illustrated before, in light-emitting devices such as ZnSe based LED, LD, etc., the SA emission of a ZnSe substrate is generated by absorption of a short wavelength light from an activation layer through the substrate and re-emitting light. Accordingly, in order to lower the SA light-emitting intensity, it is required to lower the absorption coefficient. To this end, it becomes necessary to use a substrate having a low absorption coefficient in a wavelength region of light from the activation layer for the purpose of preparing an LED of SA light-emitting free monochromatic blue color or blue green color.

When a thickness of an LED substrate is 125 $\mu$m, a light energy absorbed by the substrate is about 12% if the absorption coefficient of light from the activation layer is 10 cm$^{-1}$. Since a part of the absorbed energy is converted into heat as phonon, the re-emitted energy as the SA light from a substrate is at most 10% of the light-emitting energy from the activation layer and substantially monochromatic LED can be prepared. Accordingly, it is considered necessary to adjust the absorption coefficient of the ZnSe substrate to at most 10 cm$^{-1}$ of the light emitted from of the activation layer so as to prepare a monochromatic LED.

FIG. 1 shows an Al concentration dependence of an absorption coefficient of ZnSe of light with a wavelength of 488 nm. Any ZnSe sample is heat-treated by a method comprising maintaining ZnSe having an Al thin film formed on the surface thereof in a Zn atmosphere at 950° C. for 7 days and then cooling at a rate of 10° C./min, i.e. the Al concentration is changed by changing the thickness of the Al thin film. The Al concentration and absorption coefficient are measured using a substrate obtained by polishing by 50 $\mu$m the Al diffused surface after the heat treatment and then polishing the back surface to obtain a finished substrate with 200 $\mu$m. It is apparent from this figure that the absorption coefficient at 488 nm is substantially linearly increased with increase of the Al concentration. That is, the absorption coefficient can be controlled by the Al concentration. According to the method of the present invention, the Al concentration, which has been hard to control up to the present time, can be controlled even in a zone of about at most $5 \times 10^{18}$ atoms·cm$^{-3}$ with good reproducibility, but when the light-emitting wavelength of the LED activation layer is 488 nm, it is required to adjust the Al concentration in ZnSe to about at most $2 \times 10^{18}$ atoms·cm$^{-3}$ so as to maintain the absorption coefficient at most 10 cm$^{-3}$.

On the other hand, electric conductivity is required for ZnSe used as a substrate for LED. In order to obtain good ohmic property, a carrier density of at least $1 \times 10^{17}$ cm$^{-3}$ is required. The carrier density is determined by the Al concentration in ZnSe and its activation efficiency. The activation efficiency is determined by a cooling rate after the heat treatment, etc. and an Al concentration of at least $2 \times 10^{17}$ atoms·cm$^{-3}$ is required for obtaining a carrier density of at least $1 \times 10^{17}$ cm$^{-3}$. The substrate thickness of LED is ordinarily 100 to 250 $\mu$m and in particular, the substrate property in a zone of up to a depth of 200 to 300 $\mu$m in the vicinity of the surface is important. Accordingly, it is required for satisfying requisites of both the absorption coefficient and electric conductivity that the Al concentration in ZnSe is $2 \times 10^{17}$ to $2 \times 10^{18}$ atmos·cm$^{-3}$, preferably $5 \times 10^{17}$ to $1 \times 10^{18}$ atoms·cm$^{-3}$ in a zone of up to a depth of 300 $\mu$m from the substrate surface.

Figure 2:
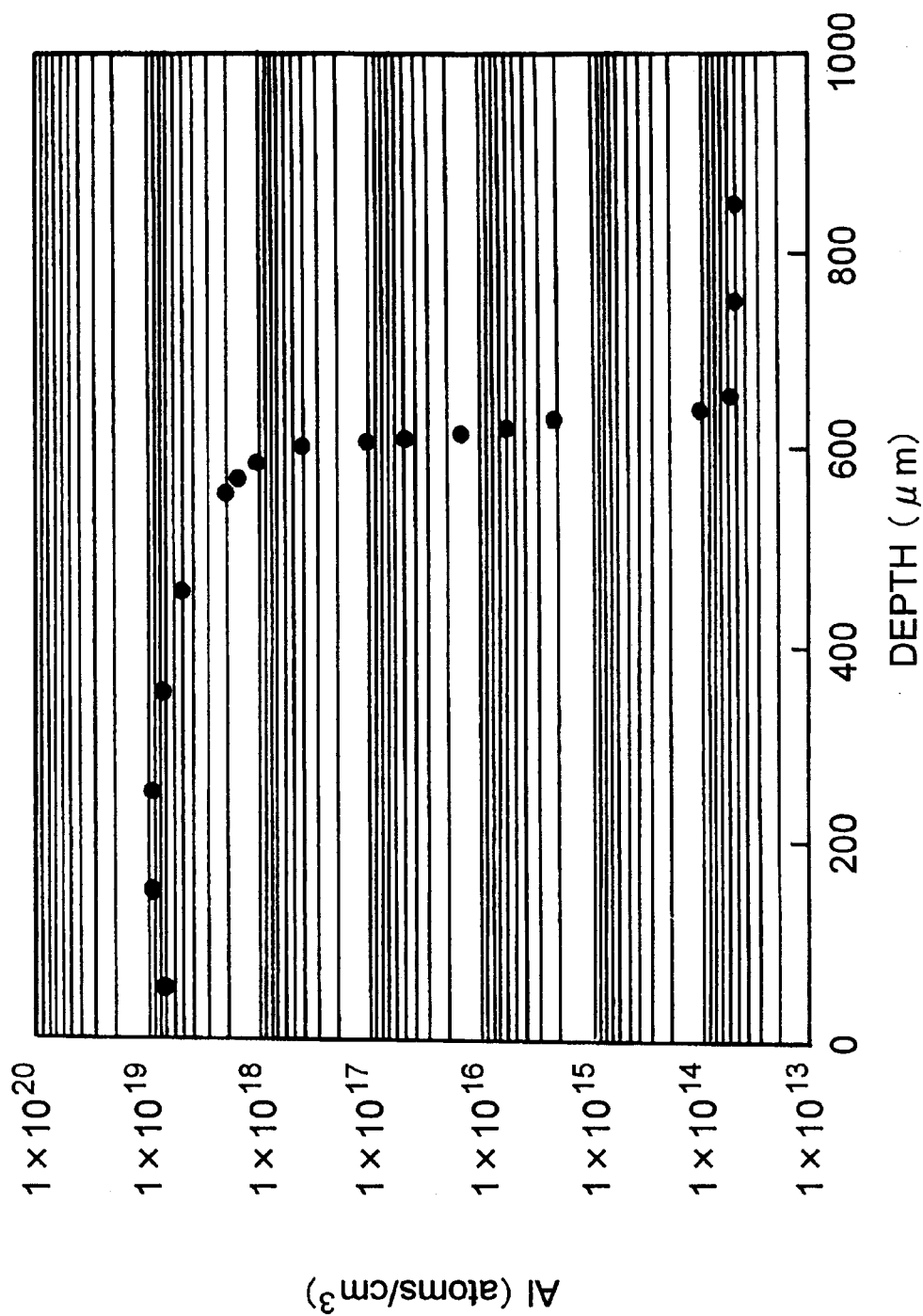
FIG. 2 is a graph showing a distribution of an Al concentration in a depth direction in a ZnSe crystal through which Al is diffused by the prior art.

In the prior art, the Al concentration in ZnSe has been controlled by the film thickness of an Al film formed on a surface of ZnSe before the heat treatment. According to this method, however, it is so difficult to control the Al concentration of about at most $5 \times 10^{18}$ atoms·cm$^{-3}$ with good reproducibilty that a ZnSe crystal suitable for a substrate for monochronic LED cannot be prepared with good reproducibility. Reasons therefor are considered as follows:

FIG. 2 shows a profile of an Al concentration in a depth direction when a ZnSe crystal substrate having an Al film formed on its surface is subjected to a heat treatment in a Zn atmosphere to diffuse Al in ZnSe. The concentration analysis is carried out by SIMS. As a primary ion of the SIMS analysis, there is used $O_2^+$ ion of 8 keV. The Al-diffused ZnSe substrate is cleaved and the thus cleaved surface is measured to obtain a concentration profile in the depth direction. The Al concentration is substantially constant, i.e. $5 \times 10^{18}$ to $1 \times 10^{19}$ atoms·cm$^{-3}$ in a zone of from the surface to 500 $\mu$m, is rapidly lowered in a zone of 500 to 600 $\mu$m and is further lowered in a zone of deeper than 600 $\mu$m to a measurable limit, i.e. $1 \times 10^{14}$ atoms·cm$^{-3}$. That is, the Al concentration in ZnSe is in a stepwise distribution, from which it is assumed that the Al diffusion coefficient in ZnSe is not constant but dependent on the Al concentration. As a result of analysis of these data, it is apparent that the Al diffusion coefficient is increased with increase of the Al concentration at an Al concentration of about at least $3 \times 10^{17}$ atoms·cm$^{-3}$ and the Al diffusion coefficient is substantially constant at an Al concentration of about at most $3 \times 10^{17}$ atoms·cm$^{-3}$. Since the Al diffusion coefficient has such an Al concentration dependence, there is a zone wherein the Al concentration is substantially constant at least $5 \times 10^{18}$ atoms·cm$^{-3}$ in the vicinity of the ZnSe surface after the heat treatment. The tendency of this concentration profile cannot be controlled even if the Al content is changed at the initial period, thus resulting in a cause that in the prior art, it is difficult to prepare a ZnSe crystal having an Al concentration of about at most $5 \times 10^{18}$ atoms·cm$^{-3}$ with good reproducibility.

As described above, the Al diffusion coefficient is increased with increase of the Al concentration, which is considered due to that the Zn vacancy concentration in ZnSe is increased by self-compensation effect of ZnSe with increase of the Al concentration. Since the increase of the Zn vacancy concentration due to the self-compensation effect is remarkable at an Al concentration of At about at least $3\times10^{17}$ atoms·cm$^{-3}$, it can be understood that the Al diffusion coefficient is increased at this Al concentration or more.

The inventors have found, as a result of elucidation of the Al diffusion mechanism, as described above, a method of diffusing with good controlling even at an Al concentration of about at most $5\times10^{18}$ atoms·cm$^{-3}$.

The Zn vacancy concentration or Se vacancy concentration in ZnSe during the heat treatment depends on the heat treatment atmosphere. That is, at a higher Zn partial pressure, the Zn cacancy is hardly present and the Se vacancy is present at a higher concentration. On the other hand, reversely, at a higher Se partial pressure, the Se vacancy is hardly present and the Zn vacancy is present at a higher concentration. The heat treatment of the prior art is carried out in a Zn atmosphere, so the Zn vacancy is in a lower concentration when Al is not resent. In this case, at an Al concentration of about at least $3\times10^{17}$ atoms·cm$^{-3}$, the Zn vacancy concentration is increased and the Al diffusion coefficient is increased. The inventors have found that when ZnSe is heat-treated in a Se atmosphere, the Zn vacancy concentration is increased even in a region with a lower Al concentration to increase the Al diffusion coefficient and control of the Al concentration is possible even in a lower concentration region than in the prior art. When the substrate is only heat treated in a Se atmosphere, however, Al is not activated and electric conductivity is not obtained. Thus, it has been found that well controlled diffusion can be obtained to give electric conductivity even at an Al concentration of about at most $5\times10^{18}$ atoms·cm$^{-3}$ by a two-stage heat treatment comprising a heat treatment in a Se atmosphere and subsequent heat treatment in a Zn atmosphere.

In the first stage heat treatment in a Se atmosphere, a ZnSe crystal substrate having a previously formed Al film on the surface thereof is subjected to a heat treatment in a Se atmosphere, during which the substrate is charged in a heat treatment vessel, for example, a closed vessel provided with a high temperature zone heated at 960 to 1200° C., preferably 1000 to 1100° C. and a low temperature zone heated at 600 to 1000° C., lower by 10 to 500° C. than the high temperature zone, the substrate is arranged to be positioned at the high temperature zone and is preferably maintained at a higher temperature with controlling the Se vapor pressure.

Al and Se form a compound of $Al_2Se_3$ having a melting point of about 960° C. Accordingly, if the heating temperature is lower than 960° C., $Al_2Se_3$ is present in the form of a solid. This is not preferable. If higher than 1200° C., the crystallinity of the ZnSe crystal is deteriorated.

Furthermore, the low temperature zone functions as a reserver part for controlling the Se vapor pressure, but if the temperature is lower than about 600° C., the Se partial pressure is lower than about 0.03 MPa and too low to prevent ZnSe from sublimation, while if higher than 1000° C., the Se partial pressure exceeds about 2.0 MPa and the inner pressure becomes too high. Thus, the temperature of the low temperature part is preferably within the above described range.

In the second stage heat treatment in a Zn atmosphere, the ZnSe crystal substrate having finished the first stage heat treatment in the Se atmosphere is subjected to a heat treatment in a Zn atmosphere. In general, the ZnSe crystal substrate having finished the above described heat treatment in the Se atmosphere and Zn are charged in the heat treatment vessel such as closed vessel and heated or held at a temperature of 660 to 1200° C., preferably 900 to 1100° C. If the heating and holding temperature is lower than 660° C., Al is present as solid so that effective diffusion through ZnSe is impossible. If exceeding 1200° C., the crystallinity of ZnSe is deteriorated through effects of temperature. In the second stage heat treatment in a Zn atmosphere, it is not necessary to provide a low temperature part, but some temperature gradient is allowed depending on the relationship with apparatus structures.

In the cooling step after the heating and holding in the Zn atmosphere, it is desirable to provide a low temperature zone of becoming lower than the temperature of the ZnSe crystal substrate in the treatment vessel. If there is no low temperature zone of becoming lower than the temperature of the ZnSe crystal substrate during cooling, Zn is cooled under such a state that Zn adheres to the ZnSe crystal substrate to deteriorate the crystallinity of ZnSe. The temperature of the low temperature zone is preferably adjusted to lower than the temperature of the ZnSe crystal substrate by 1 to 100° C., preferably 10 to 30t . If the temperature difference is less than 1° C., there is no such an effect and Zn tends to adhere to ZnSe with a high possibility, while if the temperature difference exceeds 100° C., the ZnSe crystal itself is transported to the lowest temperature part. While the high temperature is held, either the interior of the reaction vessel may be completely homogeneously heated or somewhat temperature gradient may occur to such an extent that transportation of the ZnSe crystal itself is not remarkable.

The heating and holding time in the first stage heat treatment in the Se atmosphere is 1 to 800 hours, preferably 24 to 200 hours. If less than 1 hour, Al cannot completely be diffused in the ZnSe crystal and remains on the substrate surface, which has stress upon the ZnSe crystal during cooling, thus resulting in cause of deteriorating the crystallinity. If exceeding 800 hours, Al is completely diffused through the substrate and reversely, outward diffusion is remarkable, so that the Al concentration in ZnSe is decreased with passage of time and lengthening of the heat treatment time is thus meaningless.

The second stage heat treatment time in a Zn atmosphere is 1 to 800 hours, preferably 10 to 100 hours. If less than 1 hour, Al cannot fully be activated. If exceeding 800 hours, Al is completely diffused through the substrate and reversely, outward diffusion is remarkable, so that the Al concentration in ZnSe is decreased with passage of time and lengthening of the heat treatment time is not preferable.

The cooling rate after heating and holding is 1 to 200° C./min, preferably 5 to 80° C./min in both the first stage and second stage heat treatments. Rapid cooling exceeding 200° C./min results in a large temperature gradient and deterioration of the crystallinity during the cooling step. In the case of gradual cooling of less than 1° C./min, on the other hand, the time required for cooling to room temperature is lengthened, the properties of ZnSe with the thermal equilibrium state at a high temperature are not maintained and the activation efficiency of Al is lowered to decrease the carrier density and to increase the resistivity. In the first stage heat treatment, the cooling can be stopped at a relatively high temperature, depending upon the treatment conditions, or the second heat treatment can directly be carried out by omitting the cooling step.

Generally, the heat treatment is carried out in a heat treatment vessel such as an air-tight quartz vessel, but in this case, quartz is reacted with Al to lower the controllability Al concentration diffused in the crystal. Accordingly, when Al is previously set in the vessel, an Al vapor pressure in the vessel is maintained at the Al equilibrium vapor pressure during the heat treatment to prevent the Al film from reduction through reaction with the quartz and the control property of the Al diffusion quantity can be improved.

The film thickness of the Al film formed on the surface of the ZnSe crystal substrate before the heat treatment is 50 to 5000 Å, preferably 100 to 1000 Å. If less than 50 Å, the quanity of Al is too little to obtain electric conductivity. If more than 5000 Å, Al cannot completely be diffused but Al remains on the ZnSe surface and results in deterioration of the crystallinity during the cooling step in the heat treatment. Formation of the Al film on the surface of the ZnSe crystal substrate is not limited, but a ZnSe crystal substrate, on which an Al film has separately been formed, may be used or an Al film may be formed on a ZnSe crystal substrate prior to a heat treatment in the same vessel as for the heat treatment.

When an Al film is only formed on a surface of a ZnSe crystal substrate and then subjected to a heat treatment, sometimes such a problem arises that Al is dissipated during the heat treatment, an amount of diffused Al in the crystal is decreased and the controllability of Al concentration is deteriorated. Thus, it is effective for improving the controllability of the amount of diffused Al to contact any dissipating inhibitor with the formed thin film. When other kinds of materials are used as this dissipating inhibitor, additionally, there is possibility of a new stress occurrence due to difference of the thermal expansion efficients. Accordingly, it is effective to form a ZnSe film on the Al film surface or to subject the Al film surface to a heat treatment in such a manner that another ZnSe substrate is arranged to be contacted with the Al film surface, so as to satisfy inhibition of both the Al dissipating and crystallinity deteriorating. When the ZnSe crystal substrate is used, in particular, Al can be diffused through the ZnSe crystal substrates at both sides sandwiching the thin film in between them and this method is also useful from the standpoint of productivity. During the same time, the Al film can be formed on only one side of the surface of the ZnSe crystal substrate or the Al film can be formed on both the sides of the surfaces of the ZnSe crystal substrate, and arranged so that the both are contacted. ZnSe crystal substrates, on which Al films have separately been formed, can be subjected to a heat treatment, after stacking the substrates in multistage.

When the Al film sandwiched in between ZnSe crystal substrates is subjected to a heat treatment, as described above, it is important for inhibiting dissipating of Al to realize the surface of the ZnSe crystal substrate in high flatness and smoothness as much as possible. If bending or roughness of the surface is to a large extent, tightness is lowered, so that the effect of inhibiting Al dissipating is decreased and the controllability of the amount of diffused Al is deteriorated. When an average value in plane of the surface roughness, i.e. difference of unevenness is at most 5000 Å, dissipating of Al can sufficiently be suppressed.

As illustrated above, it has been possible to diffuse Al with good controllability even at an Al concentration of at most about $5 \times 10^{18}$ atoms·cm$^{-3}$ by a two stage heat treatment in a Se atmosphere and Zn atmosphere. Accordingly, it has been possible to obtain a ZnSe crystal having an Al concentration within a range of $2 \times 10^{17}$ to $2 \times 10^{18}$ atoms·cm$^{-3}$ in a region of from the substrate surface to a depth of 300 μm and required for the ZnSe crystal excellent in electric conductivity and having a small absorption coefficient suitable for a monochromatic LED substrate.

Then, the thus obtained ZnSe crystal substrate was subjected to estimation of the properties, as exemplified below. The optical properties and electrical properties of a substrate were estimated, the substrate being obtained by a heat treatment, followed by polishing the Al-diffused side thereof by about 50 μm and polishing the back side thereof to give a finished thickness of 200 μm. The transmittance in a wavelength region of 470 to 520 nm in the vicinity of ZnSe band-gap energy was higher than an Al-diffused substrate of the prior art (one stage heat treatment) and the absorption coefficient at 488 nm was sufficiently low, i.e. 5 to 10 cm$^{-1}$. In addition, the carrier concentration was $1 \times 10^{17}$ to $4 \times 10^{17}$ cm$^{-3}$, useful as a LED substrate.

When a ZnSe substrate is heat treated at a high temperature, i.e. 600 to 800° C., in general, the uppermost surface is somewhat damaged. Accordingly, in the case of forming an epitaxial film thereon, it is required to polish again the surface thereof. After polishing, the thin-damaged layer remaining on the substrate surface induced by polishing is often removed by wet etching using a bichromate type solution. The resulting wafer is set in an MBE (molecular beam epitaxy) chamber and molecular beams of Zn and Se are irradiadiated in high vacuum. Thus, a ZnSe thin film can epitaxially be grown.

Production of LED is carried out by providing a multilayer structure on a ZnSe substrate. As this structure, there are a number of proposals have been made, one example of which is a SCH (Separate Confinement Heterostructure) comprising a ZnCdSe layer as a light-emitting layer, i.e. in order from lower, n-ZnSe buffer layer, n-ZnMgSSe clad layer, ZnSe guide layer, ZnCdSe quantum well layer, ZnSe guide layer, p-ZnMgSSe clad layer and p-ZnTe/ZnSe contact layer, on a ZnSe substrate. As an n-type dopant, there is used chlorine and as a p-type dopant, there is used nitrogen. As an electrode, further a p-type Au electrode is formed on the uppermost surface and an n-type electrode of In is formed the back surface of the ZnSe substrate. By the above described method, there can be prepared an LED having a low SA-emitting intensity and excellent properties as blue or blue-green monochromatic LED.

The ZnSe crystal substrate of the present invention comprises a mixed crystal substrate represented by a general formula, $Zn_{1-x}A_xSe$, $ZnB_ySe_{1-y}$ wherein A=Group II element, B=Group VI element, $0<x\leq0.2$ and $0<y\leq0.2$. These mixed crystal substrates are capable of giving similar effects to the ZnSe crystal substrate. Preferable examples of A include Be, Mg, Cd, etc. and preferable examples of B include S, Te, etc.

The present invention will now be illustrated in detail by the following Examples without limiting the same.

COMPARATIVE EXAMPLE 1

Figure 3A:
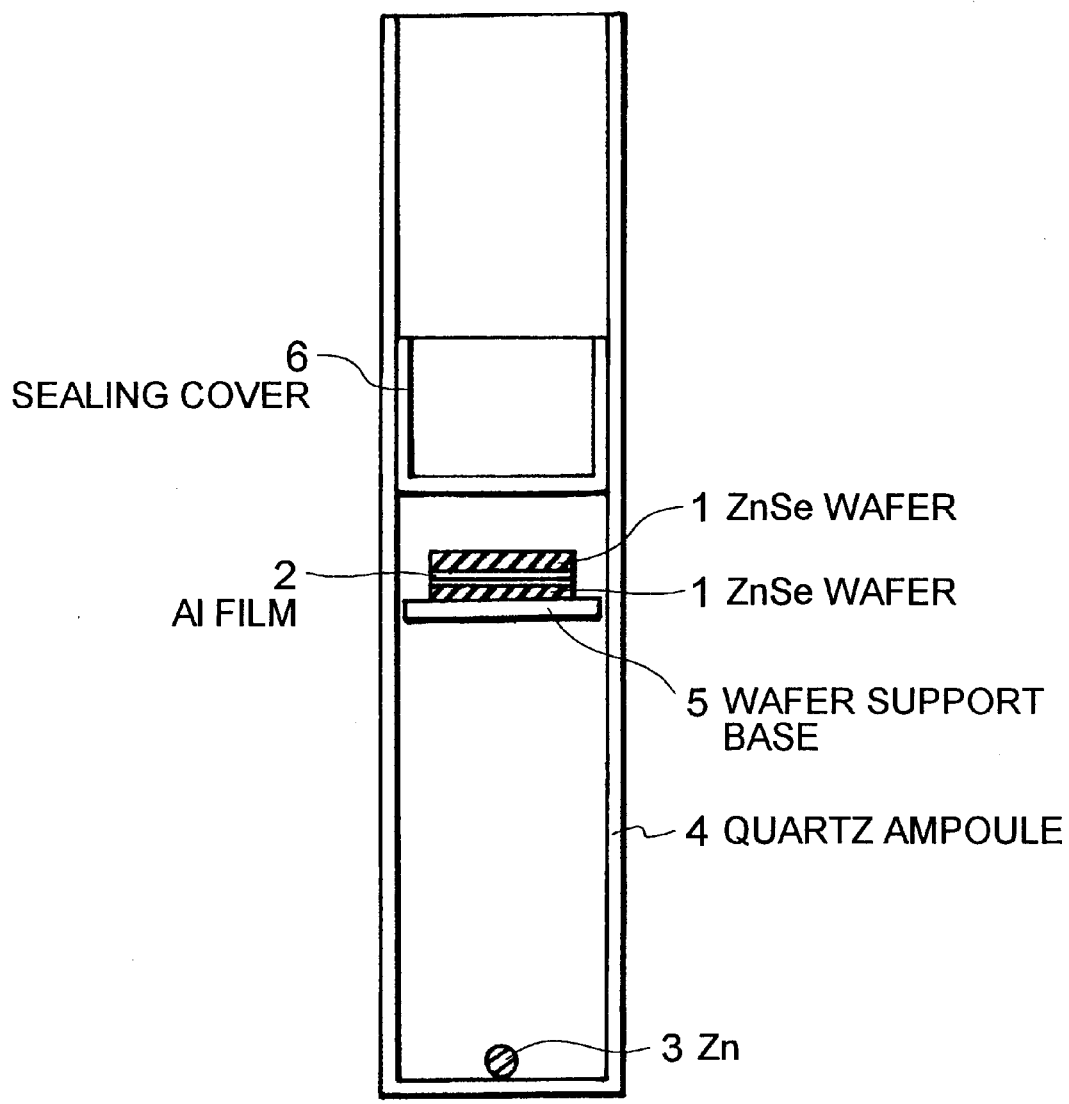
FIG. 3 (A) is a crosse-sectional view of an ampoule in which ZnSe wafer is provided in Comparative Example 1 and (B) is an enlarged view of the ZnSe wafer.
Figure 3B:
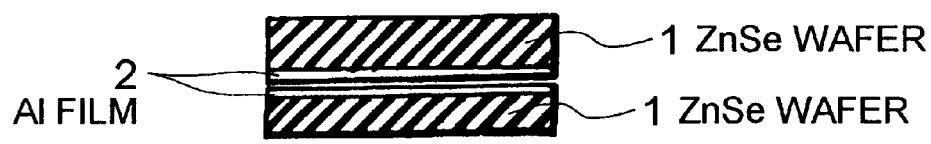

Two ZnSe single crystal wafers of (100) plane, 10 mm square and 1 mm thick, were subjected to a heat treatment. The specific resistance of this crystal before the heat treatment was large as represented by at least $10^5$ Ωcm being the upper limit of measurable range by Hall effect measurement. The wafer surface was subjected to mirror polishing and on this polished surface was formed an Al film with a thickness of 200 Å under vacuum. The average value of surface unevenness difference in plane of the surface roughness was 1000 Å. As shown in FIG. 3, these two ZnSe wafers 1 were set on a wafer support base 5 in a quartz ampoule 4 in such a manner that Al films 2 on the surfaces were faced and contacted with each other, 0.1 g of Zn 3 was further charged in the ampoule 4, covered by a sealing cover 6 and then evacuated to a vacuum of $2.66 \times 10^{-6}$ Pa, followed by sealing.

This quartz ampule 4 was set in a vertical furnace, heated, in such a manner that the ZnSe wafer 1 was at a uniform temperature of 1000° C. and the lower end of the quartz ampoule 4 was at 980° C., and maintained for 7 days, after which the ampoule was cooled to room temperature at a cooling rate of 10° C./min. While cooling, Zn was solidified at the lower end of the ampoule 4. The two faced ZnSe wafers 1 were not sticked to each other and could readily be separated. Al, deposited on the surface of ZnSe wafer 1, was diffused in the the ZnSe wafers and dissipated outwards and was not found with the naked eye on the surface thereof.

Figure 6:
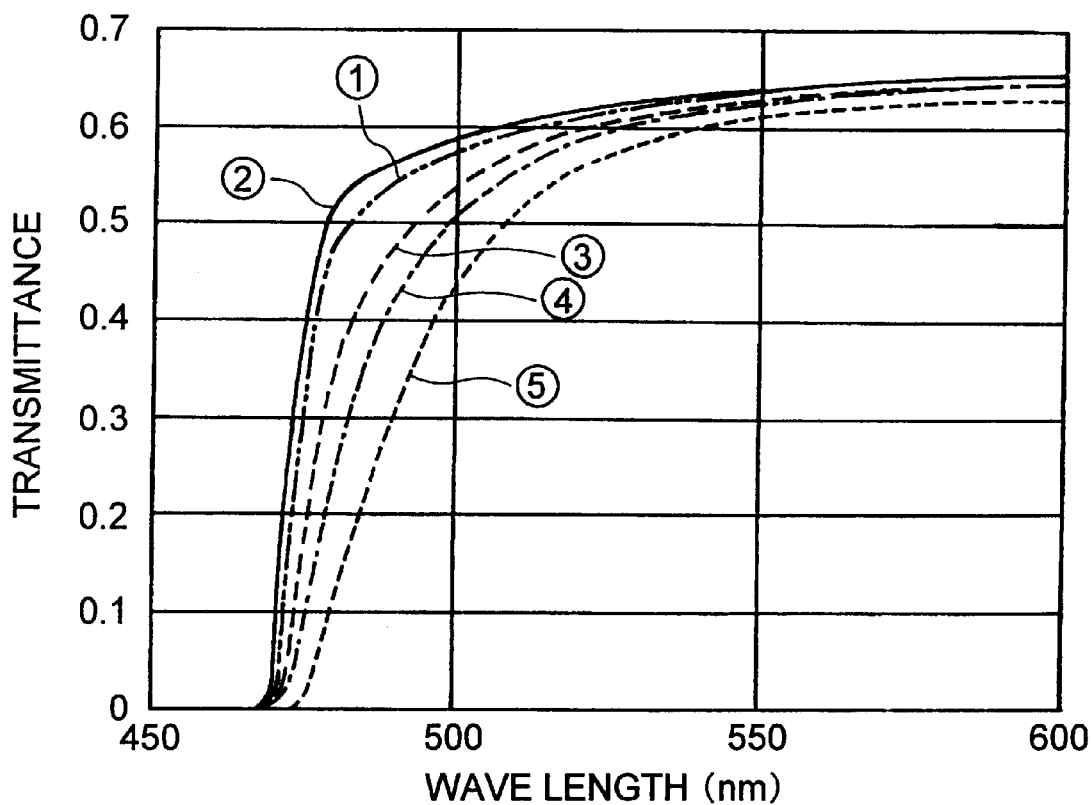
FIG. 6 is a graph showing results of transmittances measured of the ZnSe crystal substrate prepared in Example 1.

Then, the Al concentration and carrier concentration were measured as to the ZnSe wafer 1 having been heat treated and repolished by 50 μm, at the side on which the Al film 2 had been deposited. The Al concentration upto a depth of 250 μm by SIMS was in the range of about $3 \times 10^{18}$ to $5 \times 10^{18}$ atoms·cm$^{-3}$ and the carrier concentration by C-V Measurement (capacity·voltage measurement) was about $5.1 \times 10^{17}$ cm$^{-3}$. Furthermore, the back surface was polished to a wafer with a thickness of 200 μm and the transmittance was measured, thus obtaining results as shown in FIG. 6, ③. The absorption coefficient at 488 nm was about 14 cm$^{-1}$, which was somewhat higher as a monochromatic LED substrate.

Example 1

Figure 4A:
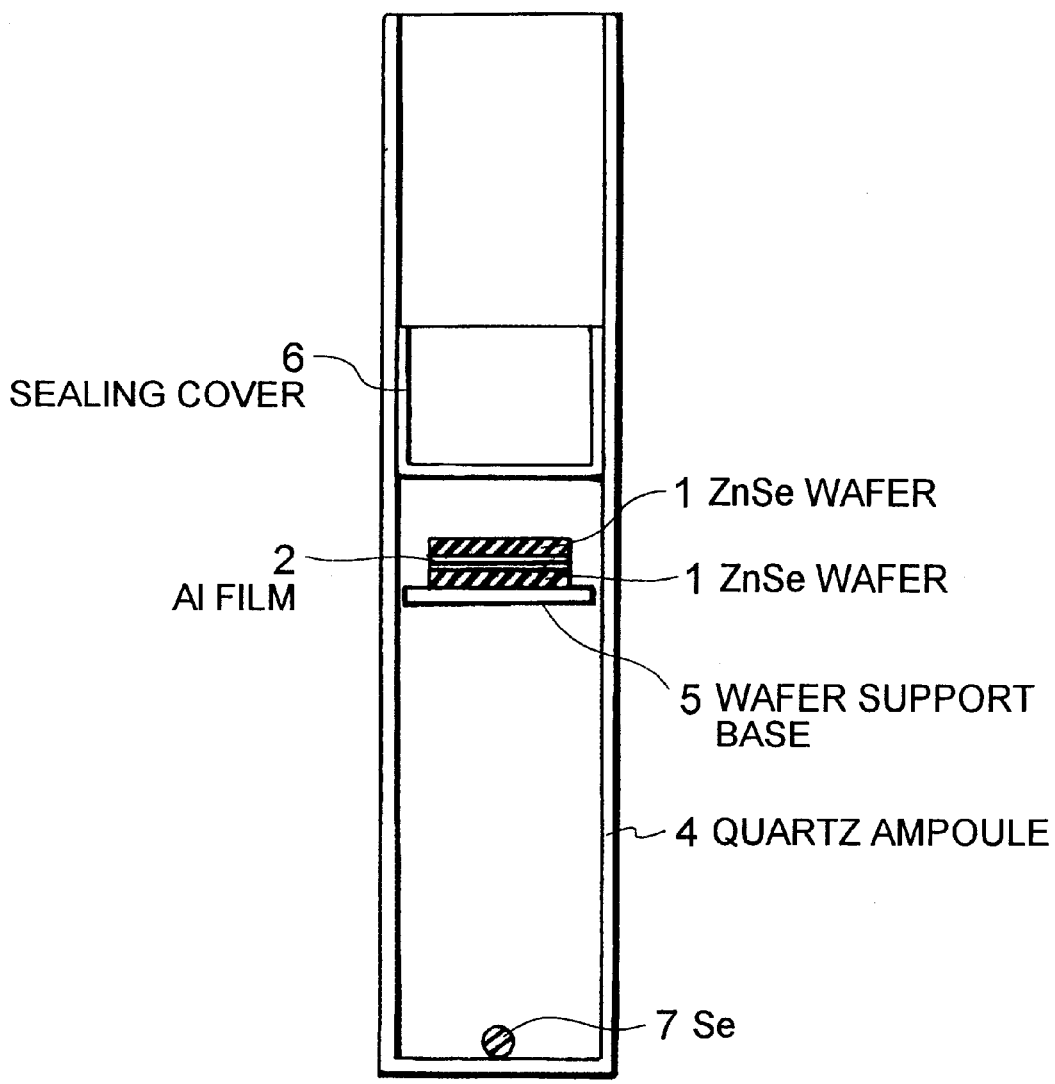
FIG. 4 (A) is a crosse-sectional view of an ampoule in which ZnSe wafer is provided in a first stage heat treatment in Example 1 and (B) is an enlarged view of the ZnSe wafer.
Figure 4B:
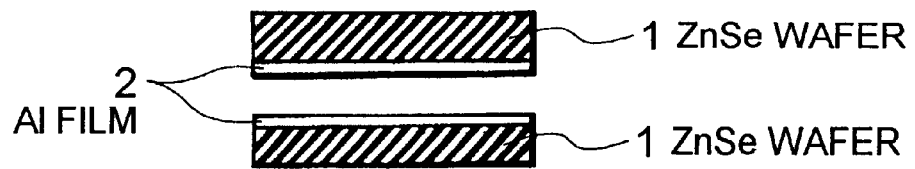

In the similar manner to Comparative Example 1, a similar Al thin film was formed on a similar ZnSe single crystal wafer. As shown in FIG. 4, these two ZnSe wafers 1 were then set on a wafer support base 5 in a quartz ampoule 4 under such a state that Al films 2 on the surfaces were faced and contacted with each other, further, 0.1 g of Se 7 was charged in the ampoule 4, covered by a sealing cover 6 and then evacuated to a vacuum of $2.66 \times 10^{-6}$ Pa, followed by sealing.

This quartz ampule 4 was set in a vertical furnace, heated in such a manner that the ZnSe wafer 1 (higher temperature part) was at a uniform temperature of 1000° C. and the lower end (lower temperature part) of the quartz ampoule 4 was at 800° C. and maintained for 7 days, after which the ampoule was cooled to room temperature at a cooling rate of 10° C./min. While cooling, Se was solidified at the lower end of the ampoule 4. The two faced ZnSe wafers 1 were not sticked to each other and could readily be separated. Al, deposited on the surface of ZnSe wafer 1, was diffused in the ZnSe wafers and dissipated outwards and was not found with the naked eye on the surface thereof.

Figure 5:
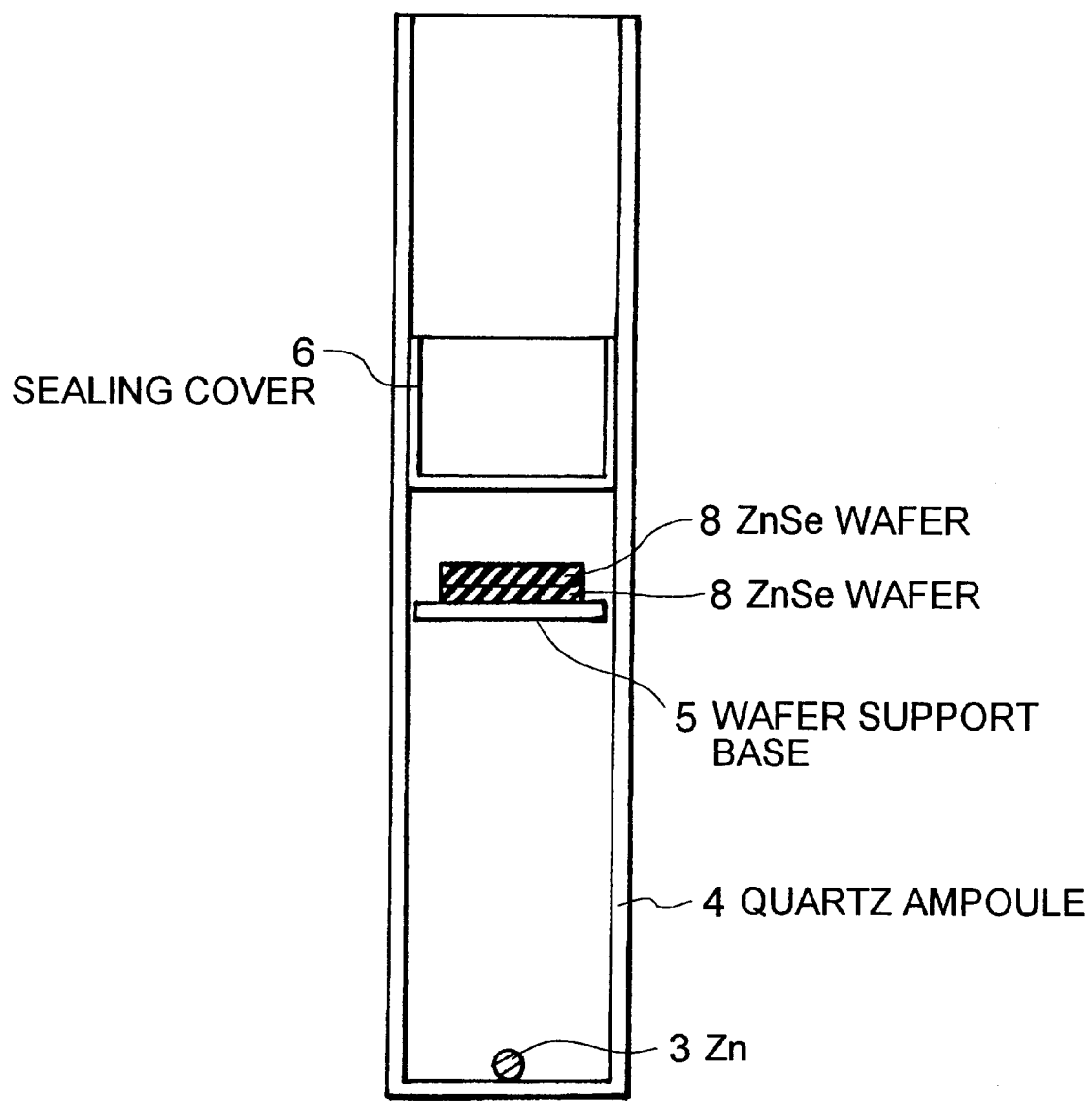
FIG. 5 is a crosse-sectional view of an ampoule in which ZnSe wafer is provided in a second stage beat treatment in Example 1.

Further, as shown in FIG. 5, the withdrawn Al-diffused ZnSe wafers 8 were set on a wafer support base 5 in a quartz ampoule 4 under such a state that Al films-deposited surfaces were faced and contacted with each other, further, 0.1 g of Zn 3 was charged in the ampoule 4, covered by a sealing cover 6 and then evacuated to a vacuum of $2.66 \times 10^{-6}$ Pa, followed by sealing.

This quartz ampule 4 was set in a vertical furnace, heated in such a manner that the ZnSe wafer 8 was at a uniform temperature of 1000° C. and the lower end of the quartz ampoule 4 was at 980° C. and maintained for 2 days, after which the ampoule was cooled to room temperature at a cooling rate of 10° C./min, while maintaining a similar temperature profile. While cooling, Zn was solidified at the lower end of the ampoule 4. The two faced ZnSe wafers 8 were not sticked to each other and could readily be separated.

Then, the Al concentration and carrier concentration were measured as to the ZnSe wafer 8 having been heat treated and repolished by 50 μm, at the side on which the Al film had been deposited. Consequently, the Al concentration upto a depth of 250 μm was in the range of about $9 \times 10^{17}$ to $1.5 \times 10^{18}$ atoms·cm$^{-3}$ and the carrier concentration was about $2.1 \times 10^{17}$ cm$^{-3}$. Furthermore, the back surface was polished to a wafer with a thickness of 200 μm and the transmittance was measured, thus obtaining results as shown in FIG. 6, ①.

FIG. 6, ② to ⑤ show results in the case of only heat treatment of the prior art, in Zn atmospheres. In particular, FIG. 6, ② shows a result in the case of carrying out a heat treatment in a Zn atmosphere without deposition of an Al film and FIG. 6, ③ to ⑤ shows results in the case of carrying out heat treatments in Zn atmospheres with deposition of Al film. In the order of ③ to ⑤, the Al film thicknesses increase and it can be understood from this graph that the transmittance is lowered with the increase of the Al film thickness, that is, with the increase of the Al concentration in ZnSe. Control of the transmittance within the range of FIG. 6, ③ to ⑤ has been possible even in the prior art through the deposited Al film thickness, but in the case of diffusing Al by the prior art method, FIG. 6, ③ is the upper limit of the transmittance, which can be prepared in stable manner.

In FIG. 6, ①, the carrier concentration is somewhat smaller as compared with that of the prior art, but the transmittance is substantially as high as that of undoped crystals. The absorption coefficient at 488 nm was about 7.1 cm$^{-1}$, which was adequately lower as a monochromatic LED substrate.

As described above, in the prior art, it has been difficult to prepare ZnSe containing Al with a concentration of at most $5 \times 10^{18}$ atoms·cm$^{-3}$ with good reproducibility. Accordingly, in the case of a ZnSe substrate having a resistance lowered by diffusing Al, one having a higher absorption coefficient and a lower transmittance within a wavelength range of 470 to 520 nm can only be prepared. FIG. 6, ③ (Comparative Example 1) shows a transmittance data of the Al concentration near the lower limit which can stably be provided according to the prior art method, and the transmittance is considerably smaller as compared with the undoped ZnSe (FIG. 6, ②). Under this condition, the Al concentration was about $4 \times 10^{18}$ atoms·cm$^{-3}$ and the carrier concentration was about $5.1 \times 10^{17}$ cm$^{-3}$. In comparison of the transmittance data of FIG. 6, ③ (Present Example) and ③ (Comparative Example 1), it is apparent that even if an Al film with the same thickness (200 Å) is formed and diffused, a ZnSe substrate having a sufficiently higher transmittance, as compared with the prior art, can be prepared by carrying out the two stage heat treatment according to the method of the present invention.

Example 2

The ZnSe crystal having Al diffused and rendered to have a lower resistance in Example 1 had a roughened surface due to damage during the heat treatment, and was not suitable as a substrate for ZnSe epitaxial growth.

Two ZnSe single crystal wafers of (100) plane, 10 mm square and 1 mm thick, having substantially the same properties as used in Example 1, were thus subjected to formation of the Al layer and two stage heat treatment. Then, the Al deposited surface was polished to remove a thickness of 100 μm and finished by mirror polishing. The wafer was then etched with a bichromate type solution to remove a wafer surface layer of 3 μm. The resulting wafer was set in an MBE chamber and a ZnSe thin film with a thickness of 1.5 μm was grown.

The grown ZnSe thin film had a good surface morphology. Since etch pits appearing on the ZnSe surface by etching using a Br-methanol solution correspond to dislocations in ZnSe, the dislocation density was measured by counting a surface density of etch pits (EPD: Etch Pit Density). When the dislocation density of the epitaxial film was measured by this method, dislocations were newly increased by about $3 \times 10^3$ cm$^{-2}$ but the total dislocation density by summing up the dislocation density from the ZnSe substrate was $8 \times 10^3$ to $2.2 \times 10^4$ cm$^{-2}$, thus maintaining a good crystallinity.

Further, when the back surface of the epitaxially grown substrate was polished to thin the substrate thickness to 250 μm and the carrier concentration of the wafer back surface was estimated by the C-V measurement method, it was confirmed that the wafer had a carrier concentration of about $2 \times 10^{17}$ cm$^{-3}$, sufficient for forming n-electrode.

Using this epitaxial wafer, LED was prepared. The wavelength of the light from the activation layer of the resulting LED was 488 nm and the SA light-emitting intensity of the substrate was so low that cannot be recognized with the naked eye, which was sufficiently excellent as a blue-green monochromatic LED.

Advantages of the Invention

In a method for the heat treatment to diffuse Al in a ZnSe crystal substrate according to the present invention, the Al concentration can be controlled with good reproducibility even in such an Al concentration range that the Al concentration in the ZnSe crystal substrate is about at most $5 \times 10$~atoms·cm$^{-3}$ and there can be provided a ZnSe crystal substrate having a lower absorption coefficient suitable for light-emitting devices such as monochromatic LED substrates.

What is claimed is:

1. A method for the heat treatment of a ZnSe crystal substrate by diffusing Al through the ZnSe crystal substrate, comprising previously forming an Al film on the substrate, first subjecting the substrate to a heat treatment in a Se atmosphere and then subjecting to a heat treatment in a Zn atmosphere.

2. The method for the heat treatment of a ZnSe crystal substrate as claimed in claim 1, wherein the Al film has a film thickness in the range of 50 to 5000 Å.

3. The method for the heat treatment of a ZnSe crystal substrate as claimed in claim 1 or 2, wherein the heat treatment is carried out under such a state that a ZnSe film is formed on the Al film of the ZnSe crystal substrate, the ZnSe crystal substrate is contacted therewith or the Al film of the Al film-formed ZnSe crystal substrate is contacted.

4. The method for the heat treatment of a ZnSe crystal substrate as claimed in claim 1 or 2, wherein the heat treatment in the Se atmosphere comprises a step of charging the ZnSe crystal substrate and Se in a heat treatment vessel provided with a high temperature part of at 960 to 1200° C. and a low temperature part of 600 to 1000° C., being lower by 10 to 500° C. than the high temperature part, arranging the ZnSe crystal substrate to be positioned at the high temperature part and maintaining at a high temperature with controlling the Se vapor pressure.

5. The method for the heat treatment of a ZnSe crystal substrate as claimed in claim 1 or 2, wherein the heat treatment in the Zn atmosphere comprises a step of charging the ZnSe crystal substrate and Zn in a heat treatment vessel and maintaining at a high temperature of 660 to 1200° C., and a step of cooling while maintaining a low temperature range being lower by 1 to 100° C. than the ZnSe crystal substrate in the closed container.

6. A ZnSe crystal substrate treated by the heat treatment method as claimed in claim 1 or 2.

7. The ZnSe crystal substrate as claimed in claim 6, wherein an Al concentration is in a range of $2 \times 10^{17}$ to $2 \times 10^{18}$ atoms·cm$^{-3}$ in a region of from the substrate surface to a depth of upto 300 μm.

8. A light emission device prepared using the ZnSe crystal substrate as claimed in claim 6.

9. A light emission device prepared using the ZnSe crystal substrate as claimed in claim 7.

* * * * *